(12) United States Patent
Wang et al.

(10) Patent No.: US 7,248,051 B2
(45) Date of Patent: Jul. 24, 2007

(54) RECEIVER COIL ARRAY FOR A MAGNETIC RESONANCE IMAGING SYSTEM

(75) Inventors: Jian Min Wang, ShenZhen (CN); Bei Zhang, Anhul (CN)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/173,068

(22) Filed: Jul. 1, 2005

(65) Prior Publication Data

US 2006/0006870 A1 Jan. 12, 2006

(30) Foreign Application Priority Data

Jul. 2, 2004 (CN) .................. 2004 1 0060142

(51) Int. Cl.
*G01V 3/00* (2006.01)
(52) U.S. Cl. ..................................... 324/322
(58) Field of Classification Search ................ 324/307, 324/309, 318, 322
See application file for complete search history.

(56) References Cited

U.S. PATENT DOCUMENTS

| | | | | |
|---|---|---|---|---|
| 4,763,076 A | * | 8/1988 | Arakawa et al. ............ 324/322 |
| 4,855,680 A | * | 8/1989 | Arakawa et al. ............ 324/314 |
| 5,075,624 A | * | 12/1991 | Bezjak ....................... 324/318 |
| 5,136,244 A | * | 8/1992 | Jones et al. ................. 324/318 |
| 5,166,618 A | * | 11/1992 | Jones et al. ................. 324/318 |
| 6,137,291 A | * | 10/2000 | Szumowski et al. ........ 324/318 |
| 6,150,816 A | * | 11/2000 | Srinivasan .................. 324/318 |
| 6,501,274 B1 | * | 12/2002 | Ledden ....................... 324/318 |
| 6,711,430 B1 | * | 3/2004 | Ferris et al. ................ 600/417 |

\* cited by examiner

*Primary Examiner*—Brij Shrivastav
*Assistant Examiner*—Dixomara Vagas
(74) *Attorney, Agent, or Firm*—Schiff Hardin LLP

(57) ABSTRACT

A receiver coil array for a magnetic resonance imaging system has multiple receiver coil loops that are decoupled from each the by a decoupling circuit that connects a pair of decoupling capacitors between any two of the receiver coil loops. One capacitor of each pair of decoupling capacitors has both ends grounded respectively through diodes of detuning circuits in the different receiver coil loops, and the other capacitor of each pair of decoupling capacitors has both ends grounded respectively through the tuning capacitors of different receiver coil loops. Alternatively the two decoupling capacitors in each pair have one end grounded through the diodes of respective detuning circuit, and the other end grounded through tuning capacitors of another said receiver coil loop.

8 Claims, 3 Drawing Sheets

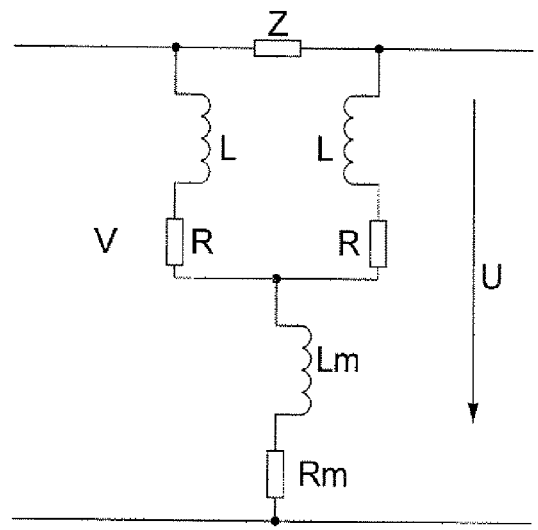
*FIG. 7*
*FIG. 8*
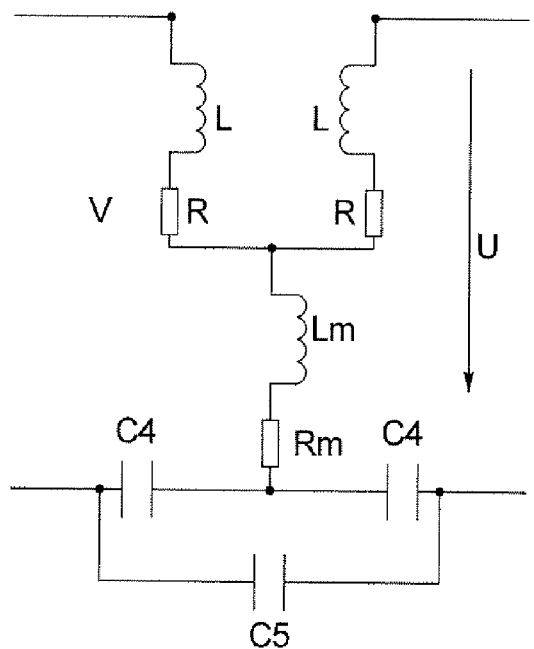

RECEIVER COIL ARRAY FOR A MAGNETIC RESONANCE IMAGING SYSTEM

BACKGROUND OF THE INVENTION

1. Field of the Invention

The present invention relates to a receiver coil array for a magnetic resonance imaging (MRI) system, particularly to a receiver coil array of an MRI system with a decoupling circuit.

2. Description of the Prior Art

Magnetic resonance imaging (MRI) is an imaging modality, wherein the signals arising from the resonance of atomic nuclei within a magnetic field are reconstructed for imaging. More specifically, the basic principle of magnetic resonance is that for an atomic nucleus with an in odd number of protons, e.g. the hydrogen nucleus that is widespread in a human body, the positively charged protons thereof exhibit spinning movements that create a magnetic moment, serving as a small magnet. The arrangement of the self-spin axes of the small magnet normally is irregular. In a homogenous strong magnetic field, however, the self-spin axes of the small magnet will be rearranged depending on the direction of the magnetic lines. In this condition, excited by the radio frequency (RF) pulse at a specific frequency, the hydrogen nucleus, serving as a small magnet, absorbs a certain amount of RF energy so as to resonate, so the magnetic resonance phenomenon occurs. Once the transmission of RF pulses is stopped, the excited hydrogen nucleus will release the absorbed energy gradually, and then its phase and energy level will resume to the state before the excitation. Different from the imaging principle of X ray, CT, etc., MRI causes no radiation harm to human body, and therefore it has provided a broad research field for clinical applications.

Magnetic resonance imaging system basically include a basic field magnet that generates the aforementioned homogenous magnetic field, a gradient magnetic field coil system, an RF coil system, a control unit that operates the gradient coil system and the RF coil system to execute a scanning sequence, and an image processing and displaying system. The gradient coil system is employed to modify the main magnetic field, and to generate a gradient magnetic field. The gradient magnetic field allows three-dimensional coding of the magnetic resonance signals in human body as to spatial orientation, though the magnetic field strength thereof is only one of several hundredths of the main magnetic field. The RF coil includes a transmitter coil and a receiver coil. The transmitter coil transmits pulses into human bodies with a proper RF pulse for excitation, serving as a short wave transmitting station and a transmitting antenna, whereas the hydrogen nucleus (atomic nucleus with an odd number of protons) within the human body receive the pulse, serving as a radio receiver. After the transmission of the pulses (excitation) is stopped, the hydrogen nucleus within the human body serves as a shortwave transmitting station, whereas the MR signal receiver serves as a radio receiver to receive magnetic resonance signals. The functions of the magnetic resonance signal receiver are realized by the receiver coils.

In order to improve the configuration of the system, the receiver coil in an MRI system is usually formed of multiple channels, which herein refers to the number of the terminals capable of receiving signals in the system, and there may be one or more receiver coils in a channel. At the same time, in the MRI system, in order to increase the signal-to-noise ratio (SNR) and enlarge the field of view (FOV) at the diagnosis (imaged) site, the most effective method is to introduce a number of loop coils into the design of the receiver coil, also known as a coil array. When using such loop coils, the coupling between the coils is relatively large. Coupling is a type of interference in the circuit. The coupling not only results in noise and affects the received signal, but also may reduce the life span of the receiver coil due to excessive induced current. Therefore, it is necessary to decouple these loop coils. Generally, however, decoupling can be performed only between two loop coils, and it is very difficult to perform decoupling among three or more loop coils.

In order to solve the problem of decoupling three loop coils, one of the conventional methods is to connect the two outer loop coils inversely. FIG. 1 shows a schematic diagram of such connection, wherein the solid line is a saddle coil, and the coordinate axis shows the size of the receiver coil in meters (m); the dashed line is a receiver coil which is folded into the shape of an "8", so that the coil is divided into two parts represented by Ring1 and Ring2 as shown respectively with L as the central coil. The receiver coils Ring 1, L, and Ring2 can be regarded as three receiver coils, with the two loop coils Ring 1 and Ring2 sharing the same voltage since they are actually formed of the same wire (conductor), and their magnetic fluxes are offset at the center. Therefore there is no coupling between the two coils, and coupling only exists between Ring1 and L, L and Ring2. Since coupling between two coils can be easily counteracted by decoupling with existing technology, decoupling of three coils is simplified into the decoupling between two coils.

The above-described solution still has certain drawbacks. First, since the magnetic flux is proportional to the signal-to-noise ratio (SNR), and the magnetic fluxes at the center of the two outer loop coils (Ring1, Ring2) are offset with respect to each other, the signal-to-noise ratio of the signals received at the center of the coil is not improved. Furthermore, since the outer Figure 8-shaped coils are actually the same coil, the voltage applied to the Figure 8-shaped coils equals that applied to the central coil L, but the length of the outer coils is about twice that of the central coil L. The longer the coil the larger the resistance the coil has, so the strength of the received signal of the outer coils is weak, therefore the improvement of the signal-to-noise ratio at the center of Ring1, Ring2 is limited. Further, since the signal received at the center of the receiver coil is the strongest, and the signal becomes weaker as the distance from the center becomes larger to a point where it cannot be detected, the field of view (FOV) is thus limited.

In order to overcome the limitation of inversely connecting the loop coils from both sides, another method, utilizing a decoupling capacitor, is provided in Siemens Internal Document Part Number: 7100303, 7100394. FIG. 2 is a schematic diagram showing such a decoupling method. In FIG. 2, decoupling circuitry of an incorporated circuit of three independent loop receiver coils is shown, wherein there is a decoupling capacitor connected between any two loop coils, as represented by Ca12, Ca13, Ca23 respectively, and the connecting point of each decoupling capacitor and the incorporated circuit lies between the inductor and the capacitor in the detuning loop, i.e., between L1 and Ca1, L2 and Ca2, L3 and Ca3 as shown in FIG. 2. Since the magnetic signals emitted from human body are received simultaneously, the direction of the current in the first coil LOOP 1 and in the second coil LOOP 2 is identical, which may enhance the signal at the center, and the signal-to-noise ratio (SNR) in the center of the receiver coil may thereby be increased. Moreover, since the coils at the two sides are two separated coils, and a voltage is applied to each coil, the signal strength received is high, and the field of view is naturally increased.

However, there are still some problems in this method. As seen in FIG. 2, the decoupling capacitor Ca12 is grounded via the capacitor Ca2, while the capacitor Ca1 has one end connected to the decoupling capacitor Ca12 and the other end grounded. Thus, the serial loop formed by the decoupling capacitor Ca12 and the capacitor Ca2 can be considered as being connected in parallel with Ca1. In other words, the detuning circuit of the first receiver coil LOOP1 at this time is composed of the above parallel circuit and L1, rather than Ca1 and L1 in an ideal state. This will lead to a change in the original detuning frequency so that it is no longer the characteristic frequency of the system, and as a result, the receiver coil cannot be completely shut off when the transmitter coil is transmitting signals. Therefore, the receiver coil will generate some interference to the signals transmitted by the transmitter coil and offset some of them. The transmitting power of the transmitter coil must be increased to compensate the signals offset, i.e., by increasing the voltage of the MRI system. Ideally, it is intended that the receiver coil be shut off completely, i.e. the receiver coil does not operate, when the transmitter coil is transmitting signals. Moreover, since the decoupling capacitors Ca12, Ca23, Ca13 are connected to the two receiver coils respectively in this decoupling method, the capacitor in each receiver coil will exert an influence on the other receiver coil. This causes the capacitor in a receiver coil to be connected, and interact with other receiver coil loops through the decoupling capacitor. Therefore, if the detuning loop of a receiver coil loop operates, the decoupling of the other two coils will be affected.

Another known decoupling method is shown in FIG. 3—the theory underlying this known technique is to perform decoupling at the other end of the ground conductor. The connecting points of the decoupling capacitors Cb12, Cb13, Cb23 with the receiver coil array circuits are at the ungrounded sides of the tuning capacitors Cb1, Cb2, Cb3 in the tuning loops of the receiver coil circuits LOOP1, LOOP2, LOOP3. Since Cb12, Cb13, Cb23 can eliminate the inductive or capacitive coupling existing in the circuit, decoupling can be realized.

Disadvantages of this method are as follows. First, since the coupling may be inductive, capacitive or resistive, although this method may offset the inductive coupling and the capacitive coupling to some extent, it cannot compensate the resistive coupling. Second, since conversions between the electric field and the magnetic field exist in the radio frequency field: if the orientation of the electric field changes, the orientation of the magnetic field changes correspondingly, which means a transition between the susceptance and the reactance in the circuit. Therefore, if the direction of the decoupling in the circuit is incorrect, the capacitance will be changed to an inductance with opposite character; or when an inverter is added, since the inductance will introduce certain resistance, additional loss will be brought to the circuit.

SUMMARY OF THE INVENTION

An object of the present invention is to provide a receiver coil array for an MRI system having a decoupling circuit, which can overcome the problem that the receiver coil in existing technology can not be shut off completely, requiring the transmitting power of the transmitter coil to be increased to compensate the signals offset, i.e. the disadvantage of increasing the voltage of the MRI system, without increasing the loss of the circuit.

The above object is achieved in accordance with the present invention by a receiver coil array for a magnetic resonance imaging system, having: more than one receiver coil circuit for receiving the magnetic resonance signals emitted from a human body, each of which has a tuning circuit, a detuning circuit and a matching circuit, the array also having a decoupling circuit countering coupling between the receiver coils, wherein decoupling circuit connects a pair of decoupling capacitors between each and every two of said receiver coil circuits. One capacitor of each pair of decoupling capacitors has both ends grounded respectively through diodes of the detuning circuits in the different receiver coil circuits, and the other capacitor of each pair of decoupling capacitors has both ends grounded respectively through tuning capacitors of the different receiver coil circuits. Alternatively the two decoupling capacitors in each pair each have one end grounded through the diodes of the detuning circuit, and the other end grounded through the tuning capacitors of another of the receiver coil circuits.

In an embodiment of the present invention, the system has three receiver coil circuits.

In another embodiment of the present invention, each pair of decoupling capacitors between the receiver coil circuits is connected such that one capacitor of each pair of decoupling capacitors has both ends grounded respectively through diodes of the detuning circuit in different receiver coil circuits, and the other capacitor of each pair of decoupling capacitors has both ends grounded respectively through tuning capacitor of the different receiver coil circuits.

In accordance with another embodiment of the present invention, the connecting points of the decoupling capacitors and the receiver coil circuits are between the inductor and the diode in the detuning circuit of the different receiver coil circuits, respectively.

In a further embodiment of the present invention, the connecting points of the decoupling capacitors and the receiver coil circuits are at the ungrounded side of the respective tuning capacitors in the tuning circuits of different receiver coil circuits.

In another embodiment, each decoupling capacitor between the receiver coil circuits has one end grounded through a diode in the detuning circuit of that receiver coil circuit, and the other end grounded through a tuning capacitor of that receiver coil circuit.

In accordance with another embodiment of the present invention, each of the decoupling capacitors has one end connected between an inductor and a diode in the detuning circuit of one of the receiver coil circuits, and the other end connected to the ungrounded side of the tuning capacitor in the tuning circuit of another one of said receiver coil circuits.

The present invention provides the advantages of:

1. Even if the capacitances of the decoupling capacitors are very large as a result of a large coil coupling, after the decoupling capacitor has been connected to the inductor, the detuning loop of the receiver coil can operate properly, since both ends of the decoupling capacitor are grounded and there is no loop current in the decoupling capacitor. Therefore, the transmitter coil will not be affected when it transmits signals, and it is not necessary to increase the transmitting power to compensate the transmitted signals that are offset, so that the potential risk related to the increase of the voltage of the MRI system is eliminated.

2. Since the decoupling capacitors are grounded through the diodes, the induced current in the decoupling loop can be eliminated, such that the capacitor in a receiver coil will not impact another receiver coil. Therefore, when a receiver coil in the array receiver coil is detuned, the decoupling circuit can operate normally as well.

3. When a coupling phase is needed, any crossed or non-crossed decoupling schemes may be used for each receiver coil to eliminate the resistive, inductive or capacitive coupling. Decoupling with the parallel or crossed scheme makes it unnecessary either to introduce the inductor into the decoupling circuit, or to add the inverter, so additional losses in the circuit will be avoided.

DESCRIPTION OF THE DRAWINGS

FIG. 7 shows an equivalent circuit of the input terminal in the embodiment as shown in FIG. 4.

FIG. 8 shows an equivalent circuit of the output terminal in the embodiment shown in FIG. 4.

DESCRIPTION OF THE PREFERRED EMBODIMENTS

Figure 1:
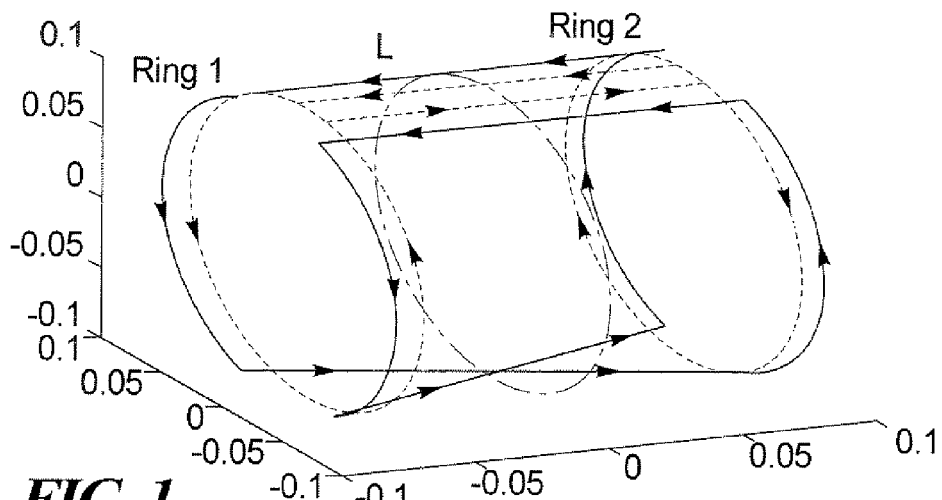
FIG. 1 shows the coupling of three receiver coils in the prior art, wherein the outer loop receiver coils are two coils arranged in a Figure "8" shape and connected inversely.
Figure 2:
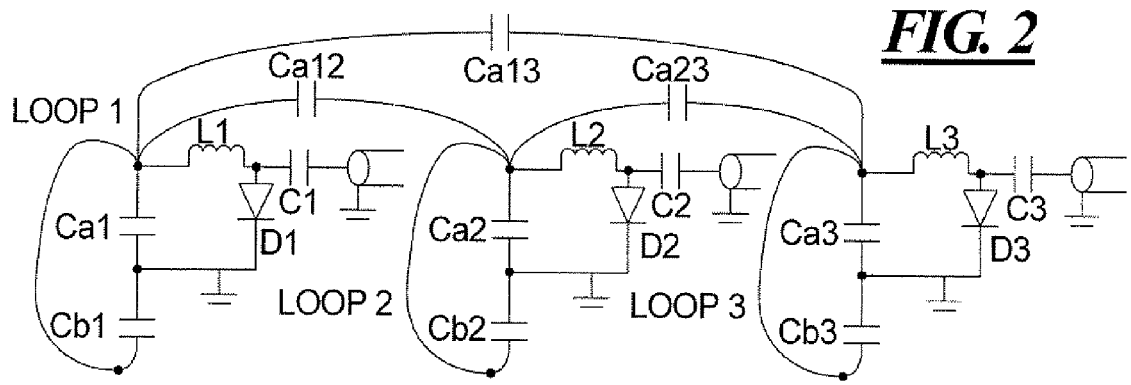
FIG. 2 shows known decoupling circuitry of an array receiver coil having three independent loop receiver coils.
Figure 3:
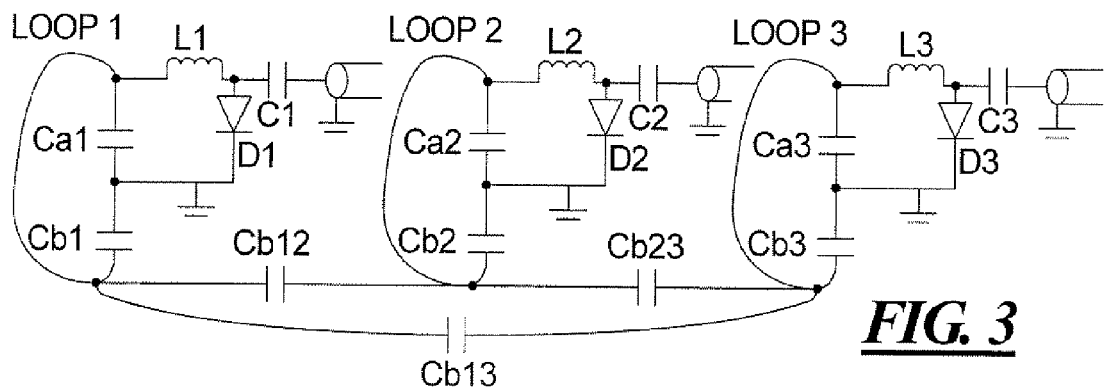
FIG. 3 shows known decoupling circuitry of a receiver coil array having three independent loop receiver coils, wherein the decoupling capacitors have one end grounded.
Figure 4:
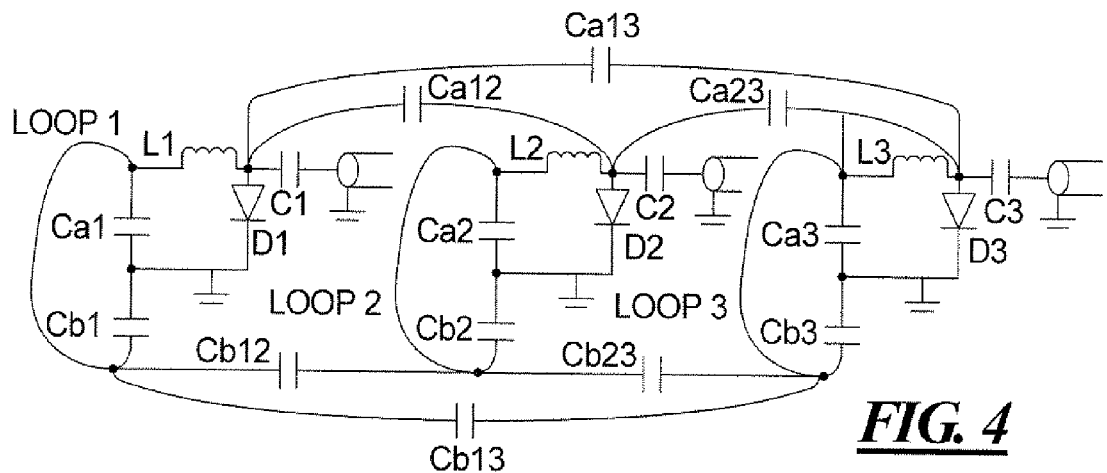
FIG. 4 shows an embodiment of the receiver coil loop array of the present invention, wherein the array loop receiver coils are parallel decoupled.

FIG. 4 shows a first embodiment of the receiver coil array for a magnetic resonance receiving system in accordance with the present invention. The receiver coil array as shown has: three receiver coil circuits LOOP1, LOOP2, LOOP3 for receiving the magnetic resonance signals emitted from a human body, each of which, e.g. LOOP1, has a tuning circuit (Ca1, Cb1, L1), a detuning circuit (Ca1, L1, D1) and a matching circuit (Ca1, Cb1, L1, C1). The receiver coil array has a decoupling circuit in which a pair of decoupling capacitors are connected between each and every two of the receiver coil circuits for countering the coupling between the receiver coils. The decoupling circuit has two decoupling capacitors Ca12, Cb12 connected between the receiver coil circuits LOOP1 and LOOP2, two decoupling capacitors Ca23, Cb23 connected between the receiver coil circuits LOOP2 and LOOP3, and two decoupling capacitors Ca13, Cb13 connected between the receiver coil circuits LOOP1 and LOOP3. The decoupling capacitor Ca12 or Ca23 or Ca13 in each pair has both ends grounded through respective diodes D1 or D2 or D3 in the detuning circuit of the different receiver coil circuits, while the other decoupling capacitor Cb12 or Cb23 or Cb13 in each pair has both ends grounded through respective tuning capacitors Cb1 or Cb2 or Cb3 of the different receiver coil circuits.

The decoupling capacitor Ca12 has both ends grounded respectively through the diodes D1, D2 in the detuning circuit of LOOP1, LOOP2, the decoupling capacitor Ca23 has both ends grounded respectively through the diodes D2, D3 in the detuning circuit of LOOP2, LOOP3, and the decoupling capacitor Ca13 has both ends grounded through the diodes D1, D3 in the detuning circuit of LOOP1, LOOP3. The decoupling capacitor Cb12 has both ends grounded respectively through the tuning capacitors Cb1, Cb2 of LOOP1, LOOP2, the decoupling capacitor Cb23 has both ends grounded respectively through the tuning capacitors Cb2, Cb3 of LOOP2, LOOP3, and the decoupling capacitor Cb13 has its both ends grounded respectively through the tuning capacitors Cb1, Cb3 of LOOP1, LOOP3.

The connecting point of the decoupling capacitor Ca12 and the receiver coil circuit LOOP1 is between the inductor L1 and the diode D1 in the detuning circuit of LOOP1, and the connecting point of Ca12 and LOOP2 is between the inductor L2 and the diode D2 in the detuning circuit of LOOP2. The connecting point of the decoupling capacitor Ca23 and the receiver coil circuit LOOP2 is between the inductor L2 and the diode D2 in the detuning circuit of LOOP2, and the connecting point of Ca23 and LOOP3 is between the inductor L3 and the diode D3 in the detuning circuit of LOOP3. The connecting point of the decoupling capacitor Ca13 and the receiver coil circuit LOOP1 is between the inductor L1 and the diode D1 in the detuning circuit of LOOP1, and the connecting point of Ca13 and LOOP3 is between the inductor L3 and the diode D3 in the detuning circuit of LOOP3.

The connecting point of the decoupling capacitor Cb12 and the receiver coil circuit LOOP1 is at the ungrounded side of the tuning capacitor Cb1 in the tuning circuit of LOOP1, and the connecting point of Cb12 and LOOP2 is at the ungrounded side of the tuning capacitor Cb2 in the tuning circuit of LOOP2. The connecting point of the decoupling capacitor Cb23 and the receiver coil circuit LOOP2 is at the ungrounded side of the tuning capacitor Cb2 in the tuning circuit of LOOP2, and the connecting point of Cb23 and LOOP3 is at the ungrounded side of the tuning capacitor Cb3 in the tuning circuit of LOOP3. The connecting point of the decoupling capacitor Cb13 and the receiver coil circuit LOOP1 is at the ungrounded side of the tuning capacitor Cb1 in the tuning circuit of LOOP1, and the connecting point of Cb13 and LOOP3 is at the ungrounded side of the tuning capacitor Cb3 in the tuning circuit of LOOP3.

In a pair of decoupling capacitors such as Ca12 and Cb12, one decoupling capacitor Ca12 has both ends grounded respectively through the diodes D1, D2, while the other decoupling capacitor Cb12 has its both ends grounded respectively through the tuning capacitors Cb1, Cb2. This kind of decoupling method is called parallel decoupling. In this embodiment, the decoupling circuits between the receiver coil circuits all employ parallel decoupling, as shown in FIG. 4.

Figure 5:
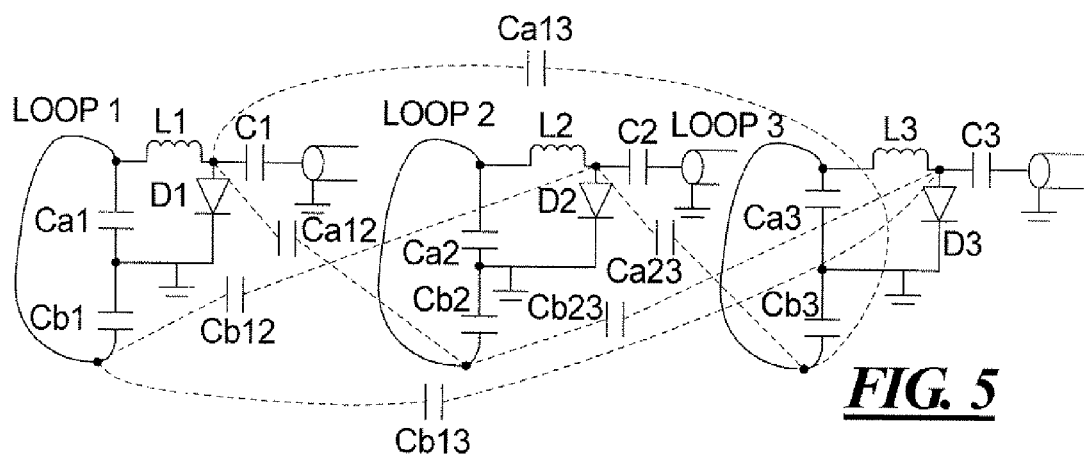
FIG. 5 shows another embodiment of the receiver coil loop array of the present invention, wherein the array loop receiver coils are cross decoupled.

FIG. 5 shows a second embodiment of an receiver coil array for a magnetic resonance receiving system in accordance with the present invention. The receiver coil array as shown has: three receiver coil circuits LOOP1, LOOP2, LOOP3 for receiving magnetic resonance signals emitted from a human body, each of which has a tuning circuit, a detuning circuit and a matching circuit. The receiver coil array has a decoupling circuit for eliminating the coupling between the receiver coils, which connects a pair of decoupling capacitors Ca12, Cb12, or Ca23, Cb23, or Ca13, Cb13 between any two of the receiver coil circuits. Different from the first embodiment, the decoupling capacitor Ca12 or Ca23 or Ca13 or Cb12 or Cb23 or Cb13 has one end grounded through a diode D1 or D2 or D3 of the detuning circuit, and the other end grounded through a tuning capacitor Cb1 or Cb2 or Cb3 of another receiver coil circuit.

There are three pairs of decoupling capacitors connected between the above three receiver coil circuits LOOP1, LOOP2, LOOP3, wherein the decoupling capacitors between LOOP1 and LOOP2 are Ca12 and Cb23, the decoupling capacitors between LOOP2 and LOOP3 are Ca23 and Cb23, the decoupling capacitors between LOOP1 and LOOP3 are Ca13 and Cb13. As can be seen in FIG. 5, the decoupling capacitor Ca12 has one end grounded through the diode D1 in the detuning circuit of LOOP1, and the other end grounded through the tuning capacitor Cb2 of LOOP2; the decoupling capacitor Cb12 has one end grounded through the tuning capacitor Cb1 of LOOP1, and the other end grounded through the diode D2 in the detuning circuit of LOOP2. The decoupling capacitor Ca23 has one end grounded through the diode D2 in the detuning circuit of LOOP2, and the other end grounded through the tuning capacitor Cb3 of LOOP3; the decoupling capacitor Cb23 has one end grounded through the tuning capacitor Cb2 of LOOP2, and the other end grounded through the diode D3 in the detuning circuit of LOOP3. The decoupling capacitor Ca13 has one end grounded through the diode D1 in the detuning circuit of LOOP1; and the other end grounded through the tuning capacitor Cb3 of LOOP3; and the decoupling capacitor Cb13 has one end grounded through the tuning capacitor Cb1 of LOOP1, and the other end grounded through the diode D3 in the detuning circuit of LOOP3.

The decoupling capacitor Ca12 has one end connected between the inductor L1 and the diode D1 in the detuning circuit of LOOP1, and the other end connected to the ungrounded side of the tuning capacitor Cb1 in the tuning circuit of LOOP2; the decoupling capacitor Cb12 has one end connected to the ungrounded side of the tuning capacitor Cb1 in the tuning circuit of LOOP1, and the other end connected between the inductor L2 and the diode D2 in the detuning circuit of LOOP2. The decoupling capacitor Ca23 has one end connected between the inductor L2 and the diode D2 in the detuning circuit of LOOP2, and the other end connected to the ungrounded side of the tuning capacitor Cb3 in the tuning circuit of LOOP3; the decoupling capacitor Cb23 has one end connected to the ungrounded side of the tuning capacitor Cb2 in the tuning circuit of LOOP2, and the other end connected between the inductor L3 and the diode D3 in the detuning circuit of LOOP3. The decoupling capacitor Ca13 has one end connected between the inductor L1 and the diode D1 in the detuning circuit of LOOP1, and the other end connected to the ungrounded side of the tuning capacitor Cb3 in the tuning circuit of LOOP3; the decoupling capacitor Cb13 has one end connected to the ungrounded side of the tuning capacitor Cb1 in the tuning circuit of LOOP1, and the other end connected between the inductor L3 and the diode D3 in the detuning circuit of LOOP3.

In a pair of decoupling capacitors such as Ca12 and Cb12, the decoupling capacitor Ca12 has one end grounded through the diode D1 of LOOP1, and the other end grounded through the tuning capacitor Cb2 of LOOP2; while the other decoupling capacitor Cb12 has one end grounded through the tuning capacitor Cb1 of LOOP1, and the other end grounded through the diode D2 of LOOP2. This kind of decoupling method is called cross decoupling. In this embodiment, the decoupling circuits between the receiver coil circuits all employ cross decoupling, as shown in FIG. 5.

Figure 6:
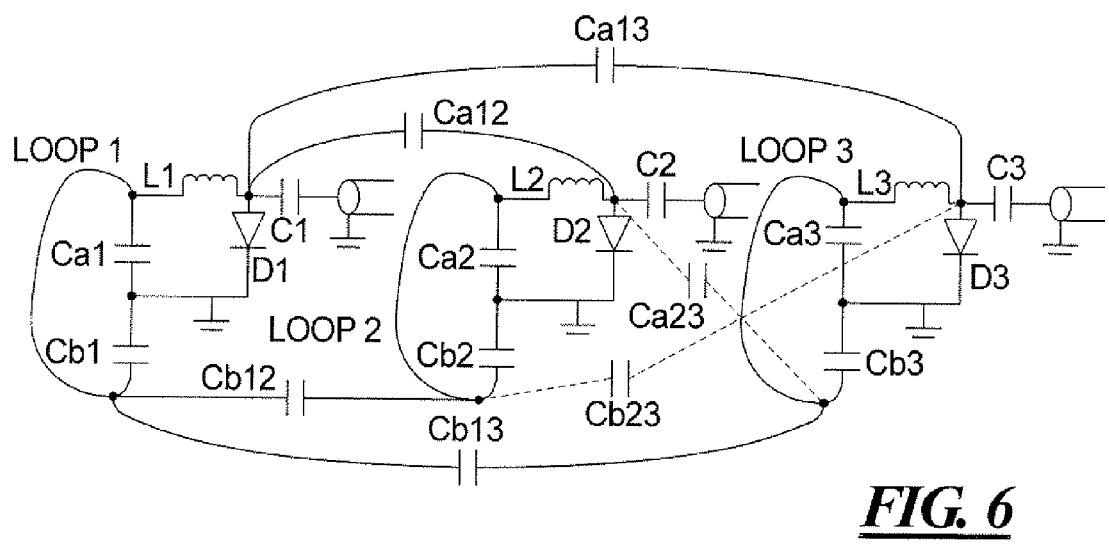
FIG. 6 shows a third embodiment of the receiver coil loop array of the present invention, wherein the loop receiver coils are either parallel decoupled or cross decoupled.

FIG. 6 shows a third embodiment of an receiver coil array for a magnetic resonance receiving system in accordance with the present invention. In this embodiment, there are three pairs of decoupling capacitors between the three receiver coil circuits LOOP1, LOOP2, LOOP3, wherein the decoupling capacitors between LOOP1 and LOOP2 are Ca12 and Cb12, the decoupling capacitors between LOOP2 and LOOP3 are Ca23 and Cb23, and the decoupling capacitors between LOOP1 and LOOP3 are Ca13 and Cb13.

Parallel decoupling is used between LOOP1 and LOOP2, and the decoupling capacitor Ca12 has its both ends grounded respectively through the diodes D1, D2 in the detuning circuit of LOOP1, LOOP2, the decoupling capacitor Cb12 has its both ends grounded respectively through the tuning capacitors Cb1, Cb2 of LOOP1, LOOP2. Cross decoupling is used between LOOP2 and LOOP3, the decoupling capacitor Ca23 has one end grounded through the diode D2 in the detuning circuit of LOOP2, and the other end grounded through the tuning capacitor Cb3 of LOOP3; the decoupling capacitor Cb23 has one end grounded through the tuning capacitor Cb2 of LOOP2, the other end grounded through the diode D3 in the detuning circuit of LOOP3. Parallel decoupling is applied between LOOP1 and LOOP2, the decoupling capacitor Ca13 has its both ends grounded respectively through the diodes D1, D3 in the detuning circuit of LOOP1, LOOP3, the decoupling capacitor Cb13 has its both ends grounded respectively through the tuning capacitors Cb1, Cb3 of LOOP1, LOOP3.

The connecting point of the decoupling capacitor Ca12 and the receiver coil circuit LOOP1 is between the inductor L1 and the diode D1 in the detuning circuit of LOOP1, and the connecting point of Ca12 and LOOP2 is between the inductor L2 and the diode D2 in the detuning circuit of LOOP2. The decoupling capacitor Ca23 has one end connected between the inductor L2 and the diode D2 in the detuning circuit of LOOP2, and the other end connected to the ungrounded side of the tuning capacitor Cb3 in the tuning circuit of LOOP3. The connecting point of the decoupling capacitor Ca13 and the receiver coil circuit LOOP1 is between the inductor L1 and the diode D1 in the detuning circuit of LOOP1, and the connecting point of Ca13 and LOOP3 is between the inductor L3 and the diode D3 in the detuning circuit of LOOP3.

The connecting point of the decoupling capacitor Cb12 and the receiver coil circuit LOOP1 is at the ungrounded side of the tuning capacitor Cb1 in the tuning circuit of LOOP1, and the connecting point of Cb12 and LOOP2 is at the ungrounded side of the tuning capacitor Cb2 in the tuning circuit of LOOP2. The decoupling capacitor Cb23 has one end connected to the ungrounded side of the tuning capacitor Cb2 in the tuning circuit of LOOP2, and the other end connected between the inductor L3 and the diode D3 in the detuning circuit of LOOP3. The connecting point of the decoupling capacitor Cb13 and the receiver coil circuit LOOP1 is at the ungrounded side of the tuning capacitor Cb1 in the tuning circuit of LOOP1, and the connecting point of Cb13 and LOOP3 is at the ungrounded side of the tuning capacitor Cb3 in the tuning circuit of LOOP3.

As shown in FIG. 6, the decoupling circuits between the receiver coil circuits of the third embodiment of the present invention employ either cross decoupling or parallel decoupling, or both.

In the present invention, the use of cross decoupling or parallel decoupling between the receiver coil circuits depends on the mutual inductance direction of the two receiver coils to be decoupled, and a determination can be made through experiment to determine whether the cross decoupling or parallel decoupling is employed.

For an MRI system, there is only an input terminal and an output terminal in this system in spite of whether the parallel decoupling or cross decoupling has been employed between the receiver coils. Hereinafter, the decoupling effect of the decoupling circuit will be analyzed in view of the input terminal and the output terminal. The input terminal refers to the connecting point of the capacitor Ca1 and the inductor L1, or the connecting point of the capacitor Ca2 and the inductor L2, or the connecting point of the capacitor Ca3 and L3 in FIG. 4 or FIG. 5 or FIG. 6, and the output terminal refers to the ungrounded side of the tuning capacitor Cb1 or Cb2 or Cb3 in FIG. 4 or FIG. 5 or FIG. 6.

(1) For the input terminal of the receiver coils:

The equivalent circuit of the decoupling loop seen from the input terminal is as shown in FIG. 7, and $$I = \frac{U}{j\omega Lm + \frac{(j\omega L + R) \cdot (j\omega L + R + Z)}{2 \cdot (j\omega L + R) + Z}} \qquad \text{(Equation 1)}$$

can be obtained from FIG. 7, wherein

I refers to the current of the branch where Rm and Lm are located;

U refers to the voltage value seen from the input;

L refers to the equivalent inductance of each receiver coil;

R refers to the equivalent resistance of each receiver coil;

Z refers to the impedance of the decoupling circuit, capacitive or inductive;

Rm refers to the resistive part of the coupling between the receiver coils;

Lm refers to the inductive reactance part of the coupling between the receiver coils; The voltage value V seen from the input can be represented by formula (2)

$$V = (j\omega Lm + Rm) \cdot I + I \frac{j\omega L + R}{2 \cdot (j\omega L + R) + Z} \cdot (j\omega L + R) \qquad \text{(Equation 2)}$$

$$\frac{V}{I} = j\omega Lm + Rm + \frac{(j\omega L + R)^2}{2 \cdot (j\omega L + R) + Z} \qquad \text{(Equation 3)}$$

If Z is capacitive, for $$Z = \frac{1}{j\omega C},$$

wherein C is the capacitance value, ω is the central angle frequency, then $$\frac{V}{I} = j\omega Lm + Rm + \frac{j\omega CR^2 - j\omega^3 CL^2 - 2R\omega^2 LC}{2 \cdot j\omega C(j\omega L + R) + 1} \qquad \text{(Equation 4)}$$

if Z is inductive, for, Z=jωL0, wherein L0 is the inductance value, then $$\frac{V}{I} = j\omega Lm + Rm + \frac{R^2 - (\omega L)^2 + 2 \cdot j\omega LR}{j\omega(2L + L0) + 2R} \qquad \text{(Equation 5)}$$

Since the equivalent resistance R of each receiver coil is very small relative to the equivalent inductance L of each receiver coil, R can be ignored. If Z is capacitive, the real part of formula (4) can be equivalent to $$RM + \frac{2RLC\omega^2(\omega^2 LC - 1)}{(2\omega^2 LC - 1)^2};$$

in case that Z is inductive, the real part of formula (5) can be equivalent to $$RM + \frac{2LR}{2L + L0}.$$

Since Rm is the resistive part of the coupling between the coils, and the coupling in fact is a mutual inductance of the magnetic fluxes which are oriented, thus Rm can be positive or negative. Depending on the practical situation, the magnitude of C in formula (4) or L0 in formula (5) (i.e. the magnitude of Z) may be adjusted, or the winding direction of the receiver coils may be changed so as to reduce the resistive coupling Rm. Therefore, the main effect of adding Ca12, Ca23 and Ca13 in the overall circuit is to remove the resistive coupling while reducing the capacitive coupling.

(2) For the output terminal of the receiver coils:

The equivalent circuitry of the decoupling loop seen from the output terminal is as shown in FIG. 8, and $$I = \frac{U}{j\omega L + R + j\omega LM + Rm + \frac{1}{j\omega\left(\frac{C4 \cdot C5}{C4 + C5} + C4\right)}} \qquad \text{(Equation 6)}$$

can be obtained from FIG. 8, wherein the symbols in formula (6) are the same as those in Equation (1), that is:

I refers to the current of the branch where Rm and Lm are located;

U refers to the voltage value seen from the input;

L refers to the equivalent inductance of each receiver coil;

R refers to the equivalent resistance of each receiver coil;

C4, C5 refer to the impedance of the decoupling coil, capacitive or inductive;

Rm refers to the resistive part of the coupling between the receiver coils;

Lm refers to the inductive reactance part of the coupling between the receiver coils.

$$V = 1 \cdot (Rm + j\omega LM) + I \cdot \frac{\frac{1}{j\omega C4}}{\frac{C4 + C5}{j\omega C4 \cdot C5} + \frac{1}{j\omega C4}} \cdot \frac{1}{j\omega C4} \qquad \text{(Equation 7)}$$

-continued $$\frac{V}{I} = Rm + j\omega Lm + \frac{\frac{1}{j\omega C4}}{\frac{C4+C5}{C5}+1}$$ (Equation 8)

It can be seen from formula 8, C4, C5 will only cause the imaginary part of equation 8 to change, and will not impact the real part of Rm, i.e. when the output terminal is decoupled, the added capacitor or inductor has no impact to Rm.

As can be seen from the analysis of the input terminal and output terminal of the receiver coils, in the overall circuit, the decoupling capacitor Ca12 between the receiver coil LOOP1 and the receiver coil LOOP2, the decoupling capacitor Ca23 between the receiver coil LOOP2 and the receiver coil LOOP3, and the decoupling capacitor Ca13 between the receiver coil LOOP1 and the receiver coil LOOP3 constitute a decoupling circuit on the end of the detuning loop of the receiver coils, thus the resistive coupling between the receiver coils can be removed. The decoupling capacitor Cb12 between the receiver coil LOOP1 and the receiver coil LOOP2, the decoupling capacitor Cb23 between the receiver coil LOOP2 and the receiver coil LOOP3, and the decoupling capacitor Cb13 between the receiver coil LOOP1 and the receiver coil LOOP3 constitute a decoupling circuit on the end of the ground, thus the inductive or capacitive coupling between the receiver coils can be removed.

Based on the receiver coil structure of the known MRI system that is commercially available from Siemens AG, there is one receiver coil in each channel, thus there are three parallel loop receiver coils in three channels, and a saddle coil is added on the periphery thereof, thereby forming a four channel coil. Since the respective directions of current in of the saddle coil and those of the other three array receiver coils are perpendicular to each other, there is no coupling between the saddle coil and the other three receiver coils, but the saddle coil may increase the signal-to-noise ratio of the four channel coil when receiving signals, so that the overall receiving effect of the receiver coils is improved. According to the decoupling circuit in FIG. 4, calibration and test are carried out on a network analyzer to detect the decoupling effect between the loop coils, such that the basic functions of the receiver coils can be achieved without increasing the voltage of the MRI system. The following Table 1 shows the reflected transmission parameters, i.e. S parameters, obtained from the network analyzer.

TABLE 1

S parameters of the four channel coil

| CH | CH | | | |
|---|---|---|---|---|
|  | 1 | 2 | 3 | 4 |
| 1 | −29.1 dB | −18.1 dB | −38.3 dB | −19.1 dB |
| 2 |  | −29.8 dB | −16.3 dB | −16.6 dB |
| 3 |  |  | −37.2 dB | −27.0 dB |
| 4 |  |  |  | −36. dB |

The row and column in the table represent the channel number in the MRI system, the values on the diagonal line represent the reflection coefficient of a channel, which represents the matching degree of the circuitries. Generally, when the reflection coefficient is below −20 dB, the circuits can be considered as matched, and the signal transmission reaches the upper limit, thus the receiving efficiency is maximized; the values that are outside the diagonal line represent the coupling coefficient between two different channels, and the degree of coupling between the coils can be seen from the coupling coefficients; it can be considered that the coupling between the coils passes muster if the value is below −15 dB. As seen from the experimental results, the reflection coefficients on the diagonal line are all below −20 dB, and those outside the diagonal lines are all below −15 dB, thus it is decided that the decoupling circuit meets the design requirement completely.

As can be seen from the results of Table 1, according to the present invention the coupling between the receiver coils satisfies the operation requirements, and the detuning circuit of the receiver coils maintains the original detuning frequency, such that when the signals are transmitted by the transmitter coil, the receiver coils are shut off completely or shut off to a sufficient degree so the receiver coil will not interfere with the signals transmitted by the transmitter coil. Therefore it is not necessary to increase the transmitting power of the transmitter coil to compensate the signal offset, i.e. it is not necessary to increase the voltage of the MRI system, and thus the life span of the receiver coils of the MRI system is prolonged.

We claim as our invention:

1. A receiver coil array for a magnetic resonance imaging system, comprising:

a plurality of receiver coil circuits adapted to simultaneously receive magnetic resonance signals emitted from a subject, each of said receiver coil circuits comprising a tuning circuit comprising a tuning capacitor, a detuning circuit comprising a diode, and a matching circuit; and a decoupling circuit for countering coupling among said plurality of receiver coil circuits that occurs when multiple receiver coil circuits in said plurality of receiver coil circuits simultaneously receive said magnetic resonance signals, said decoupling circuit comprising, between each and every two of said plurality of receiver coil circuits, a pair of decoupling capacitors, a first decoupling capacitor in each pair having both ends grounded through respective diodes of respective detuning circuits in different ones of said receiver coil circuits, and a second decoupling capacitor in each pair having both ends grounded through respective tuning capacitors of respective tuning circuits of different ones of said receiver coil circuits.

2. A receiver coil array as claimed in claim 1 comprising three of said receiver coil circuits.

3. A receiver coil array as claimed in claim 1 wherein each detuning circuit comprises an inductor, and wherein respective connection points for each first decoupling capacitor in each of said pairs is disposed between the inductor and the diode in the respective detuning circuits of the different ones of said plurality of receiver coil circuits.

4. A receiver coil array as claimed in claim 1 wherein each of said tuning capacitors has a grounded side and an ungrounded side, and wherein each second decoupling capacitor of each pair of decoupling capacitors is respectively connected to the ungrounded side of the respective tuning capacitors in the different ones of said plurality of receiver coil circuits.

5. A receiver coil array for a magnetic resonance imaging system, comprising:

a plurality of receiver coil circuits adapted to simultaneously receive magnetic resonance signals emitted from a subject, each of said receiver coil circuits comprising a tuning circuit comprising a tuning capacitor, a detuning circuit comprising a diode, and a matching circuit; and a decoupling circuit for countering coupling among said plurality of receiver coil circuits that occurs when multiple receiver coil circuits in said plurality of receiver coil circuits simultaneously receive said magnetic resonance signals, said decoupling circuit comprising, between each and every two of said plurality of receiver coil circuits, a pair of decoupling capacitors, with each decoupling capacitor in each pair having a first end grounded through the diode of the detuning circuit in one of said plurality of receiver coil circuits, and another end grounded through the tuning capacitor in the tuning circuit of a different one of said plurality of receiver coil circuits.

6. A receiver coil array as claimed in claim 5 comprising three of said receiver coil circuits.

7. A receiver coil array as claimed in claim 5 wherein each detuning circuit further comprises an inductor, and wherein each tuning capacitor has a grounded side and an ungrounded side, and wherein said one end of each of said decoupling capacitors in each pair is connected between the inductor and the diode in the detuning circuit in said one of said plurality of receiver coil circuits, and wherein said other end of each decoupling capacitor in each pair is connected to the ungrounded side of the tuning capacitor of said different one of said plurality of receiver coil circuits.

8. A receiver coil array for a magnetic resonance imaging system, comprising:

a plurality of receiver coil circuits adapted to simultaneously receive magnetic resonance signals emitted from a subject, each of said receiver coil circuits comprising a tuning circuit comprising a tuning capacitor, a detuning circuit comprising a diode, and a matching circuit; and a decoupling circuit for countering coupling among said plurality of said receiver coil circuits that occurs when multiple receiver coil circuits in said plurality of receiver coil circuits simultaneously receive said magnetic resonance signals, said decoupling circuit comprising a plurality of pairs of decoupling capacitors, each pair of decoupling capacitors being grounded either by a first set of grounding paths or a second set of grounding paths, said first set of grounding paths comprising a connection of both ends of a first decoupling capacitor in each pair through respective diodes of respective tuning circuits in different ones of said receiver coil circuits, and a connection between both ends of a second decoupling capacitor in each pair through respective tuning capacitors in the respective tuning circuits of said different ones of said receiver coil circuits, and said second set of grounding paths comprising a connection of one end of each decoupling capacitor in a pair through the diode in the detuning circuit in one of said plurality of receiver coil circuits, and a connection of the other end of each decoupling capacitor in that pair through the tuning capacitor of the tuning circuit of another of said plurality of receiver coil circuits.

* * * * *